United States Patent [19]

Grimm

[11] 4,349,878
[45] Sep. 14, 1982

[54] ARRANGEMENT FOR DETECTING DISTURBANCES INFLUENCING THE NETWORK FREQUENCY IN ELECTRIC POWER SUPPLY SYSTEMS AND USE OF SUCH ARRANGEMENT IN AN ADAPTIVE AUTOMATIC FREQUENCY CONTROL SYSTEM FOR AN ELECTRIC POWER SUPPLY SYSTEM

[76] Inventor: German Grimm, Anton-Günther-Strasse 7, 8060 Dachau, Fed. Rep. of Germany

[21] Appl. No.: 102,550

[22] Filed: Dec. 10, 1979

[30] Foreign Application Priority Data

Dec. 15, 1978 [DE] Fed. Rep. of Germany ....... 2854315

[51] Int. Cl.³ ............................................. G01R 23/00
[52] U.S. Cl. .................................... 364/484; 328/134; 364/550
[58] Field of Search ............... 364/483, 484, 485, 492, 364/550; 324/78 Q, 78 D, 77; 328/141, 134

[56] References Cited

U.S. PATENT DOCUMENTS

| | | | |
|---|---|---|---|
| 3,932,737 | 1/1976 | Delepine | 364/484 |
| 3,990,007 | 11/1976 | Hohhof | 364/464 X |
| 4,037,151 | 7/1977 | Takeuchi | 364/484 X |
| 4,073,009 | 2/1978 | Andow et al. | 364/483 X |
| 4,074,191 | 2/1978 | Jules | 328/134 X |
| 4,137,496 | 1/1979 | Lind | 324/78 D X |
| 4,137,497 | 1/1979 | Lowenschuss | 364/484 X |
| 4,144,491 | 3/1979 | Hutcheon | 328/134 X |
| 4,157,457 | 6/1979 | Sakoe et al. | 364/485 X |
| 4,236,112 | 11/1980 | Boldridge, Jr. | 364/845 X |

*Primary Examiner*—Edward J. Wise
*Attorney, Agent, or Firm*—Brown & Martin

[57] ABSTRACT

An arrangement for detecting disturbances influencing the network frequency in electric power supply systems is suggested and the use of such an arrangement in an adaptive automatic frequency control system for electric power systems is disclosed. A first measuring channel responsive to the frequency to be monitored comprises delay and sample circuit means operated by timer means connected in a second measuring channel responsive to the frequency change rate. Output signals of said delay and sample circuit means giving a history of the frequency change to be monitored, are compared and processed in an arithmetic unit to obtain information about the power flow in the network causing the frequency disturbance and the location of the disturbance, respectively.

8 Claims, 5 Drawing Figures

ARRANGEMENT FOR DETECTING DISTURBANCES INFLUENCING THE NETWORK FREQUENCY IN ELECTRIC POWER SUPPLY SYSTEMS AND USE OF SUCH ARRANGEMENT IN AN ADAPTIVE AUTOMATIC FREQUENCY CONTROL SYSTEM FOR AN ELECTRIC POWER SUPPLY SYSTEM

FIELD OF THE INVENTION

This invention relates to an arrangement for detecting disturbances influencing the network frequency in electric power supply systems, comprising first measuring circuitry for ascertaining the deviation of the system frequency from a desired frequency and second measuring circuitry for ascertaining the rate of frequency change. The invention relates also to the use of such arrangement in an adaptive automatic frequency control system for an electric power supply system.

DISCUSSION OF PRIOR ART

Such arrangements and their use have been disclosed in "VDE-Fachberichte" No. 30, VDE-Verlag GmbH, Berlin, on pages 303 to 312 in an article entitled "Einsatz eines Mikrorechners zur nichtlinearen Filterung des Netzfrequenzrauschens bei der Primärregelung" (Use of a Microcomputer for a Nonlinear Filtering of the Systems Frequency Noise in an Automatic Primary Control).

In the known arrangement the response of the automatic control system is adapted to the actual disturbance in the power supply system in that the zero for the automatic control is shifted in dependence on the deviation of the supply system frequency or in that a dead band for the automatic control is controlled in dependence on the rate of the frequency change taking place in response to a disturbance. Thus, the known arrangements comprise the above-mentioned measuring circuitries for ascertaining the deviation of the system frequency and for ascertaining the rate of frequency change, and the output signals of the measuring circuitries are evaluated.

SUMMARY OF THE INVENTION

It is an object of the present invention so to improve an arrangement of the kind described first hereinbefore that the arrangement furnishes comparatively exact information on the disturbance. Where such information is to be used for an adaptive automatic frequency control, it is an object of the invention to permit an automatic control which is relatively insensitive to usual frequency fluctuations but which responds quickly and effectively to strong disturbances.

This object is accomplished according to the invention in that the first-mentioned measuring circuitry comprises delay and sample circuitry having a plurality of outputs and adapted to deliver at one of said outputs a signal which represents the frequency immediately before the disturbance has appeared and to deliver at another of said outputs a signal which represents the frequency shortly, e.g., 10 seconds, after the disturbance has appeared, that, furthermore, a timer is connected to the second measuring circuitry and is provided with a plurality of clock outputs for controlling the delay and sample circuitry, and a comparator is provided, which is adapted to receive the output signals of the delay and sample circuitry and has an output which is coupled to an indicator for giving an indication of the power which flows in or out at the location of the disturbance.

The output of the comparator is preferably coupled to the indicator by a multiplication circuit, in which the output signal of the comparator can be multiplied with a selectable factor.

According to a preferred further feature, the multiplication circuit and a peak-holding circuit, which succeeds the second measuring circuitry and delivers a signal which represents the maximum rate of frequency change which has been ascertained, may feed an arithmetic network, which produces an output signal Z in accordance with the following arithmetic operation:

$$Z = Z_0 e^{\alpha \frac{PA}{\dot{f}_{max}}}$$

wherein $Z_0$ and $\alpha$ are selectable constants which have been fed to the arithmetic network, PA is the output signal of the multiplication circuit and $\dot{f}_{max}$ the output signal of the peak-holding circuit. The arithmetic network is connected to a second indicator, which furnishes an indication of the distance between the location at which monitoring takes place and the origin of the disturbance or preferably an indication of the equivalent impedance of the power supply system between the monitoring location and the origin of the disturbance.

Desirable further features and developments of the arrangement and its use are recited in the accompanying claims, which are incorporated in the description by reference with the intention to simplify and shorten the latter.

BRIEF DESCRIPTION OF THE DRAWINGS

Embodiments of the invention will now be explained more in detail and by way of example with reference to the drawing, in which.

DETAILED DESCRIPTION OF PREFERRED EMBODIMENT

Figure 1:
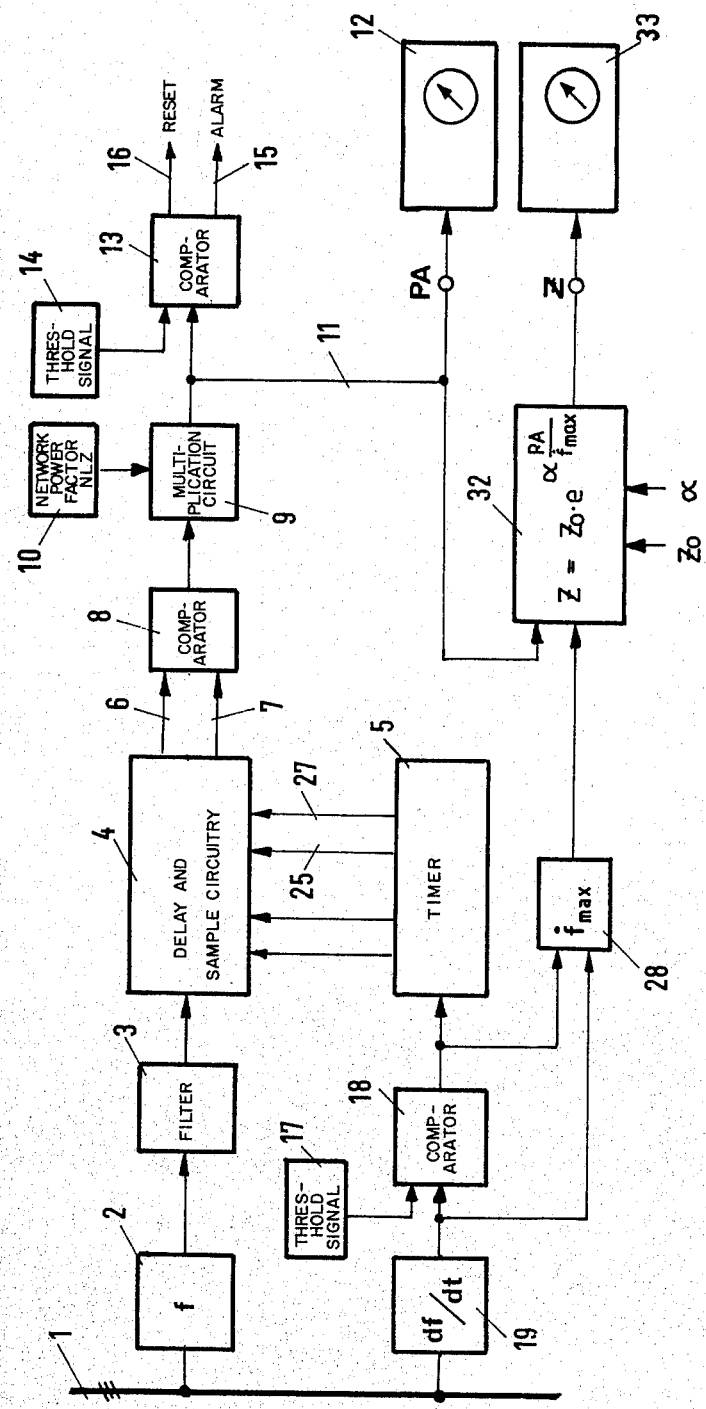
FIG. 1 is a block circuit diagram showing an arrangement for detecting network frequency influencing disturbances, comprising means for indicating power which flows out or is no longer available at the origin of the disturbance, and means for indicating the distance to the origin of the disturbance or the effective equivalent impedance of the supply system between the location at which monitoring takes place and the origin of the disturbance.

A measuring transducer 2 is connected to a power supply system that is diagrammatically indicated at 1 in FIG. 1. The transducer 2 delivers an output signal which represents the instantaneous system frequency. That signal is passed through a filter 3, in which an inevitable frequency noise is eliminated so that the succeeding subassemblies will not respond to continual small frequency fluctuations, which may be due to the cycling of machines.

The filter delivers its output signal to delay and sample circuitry 4, which is controlled by a timer 5 and will be described more in detail hereinafter with reference to FIG. 3. One output 6 of the delay and sample circuitry 4 delivers a signal which represents the frequency that had been ascertained in the power supply 1 immediately before the disturbance has appeared. Another output 7 of the circuitry 4 delivers a signal which represents the frequency ascertained in the system 1 a short time after the disturbance has appeared. In the practical monitoring of power supply systems, said short time amounts to about 10 seconds.

The output signals in leads 6 and 7 are compared in the comparator 8, and the signal which represents the result of the comparison is delivered to a multiplication circuit 9 and is multiplied therein with a proportionality factor, which depends on the properties of the power supply system being monitored and is generally referred to as network power factor of the power supply system. The network power factor of the power supply system indicates the magnitude of the disturbing power per unit of frequency deviation. The subassembly for setting the network power factor of the power supply system is indicated in FIG. 1 at 10. The output signal of the multiplication circuit 9 is delivered via lead 11 to an indicator 12, which furnishes an indication of the disturbing power. This information may indicate the power of a power plant which has failed or the magnitude of a load which has been disconnected or dumped or a short-circuit power.

The output signal of the multiplication circuit 9 is also compared in a comparator 13 with a selectable set point signal, which is delivered by an adjustable set point signal generator 14. An alarm can be triggered via a lead 15 when a certain frequency deviation is exceeded. Via another output 16, the comparator 13 delivers a resetting signal for resetting certain subassemblies of the circuitry particularly in the delay and sample circuitry. This will be discussed more fully hereinafter. This resetting is effected when the frequency deviation which appears and the disturbing power do not exceed certain limits.

The timer 5 is started to deliver control signals for the delay and sample circuitry 4 when the rate of frequency change exceeds a threshold value, which is delivered by a threshold value signal generator 17. This condition is detected by a comparator 18, which receives at one input the output signal of the threshold value signal generator 17 and at its other input the output signal of a measuring transducer 19, which ascertains the rate of frequency change.

Figure 3:
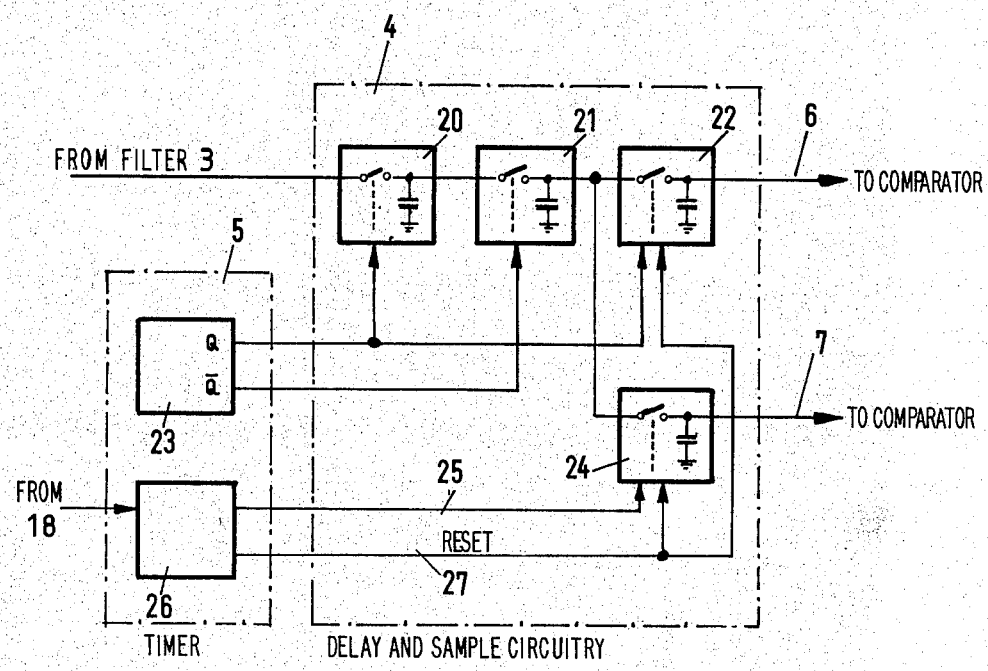
FIG. 3 is a simplified circuit diagram showing the delay and sample circuitry and the associated clock means.

It is apparent from FIG. 3 that the delay and sample circuitry 4 comprises a cascade of, e.g., three series-connected sample and hold circuits 20, 21 and 22. The diagrammatically indicated control inputs of the sample and hold circuits 20 and 21 are so connected to a quartz-controlled clock that the sample and hold circuits 20 and 21 are operated in alternation and the input signal delivered by the filter and corresponding to the instantaneous frequency in the power supply system 1 is advanced by the sample and hold circuits 20 and 21 as in a register in steps controlled by the clock pulses. The clock frequency of the clock 23 is selected so that the signal appearing at the output of the sample and hold circuit 21 is always representative of the frequency which had been ascertained in the power supply system about one second to two seconds before. This signal is made available in the sample and hold circuit 22 until the signal is eliminated, after about 70 seconds.

The output of the sample and hold circuit 21 is also connected to a fourth sample and hold circuit 24, which is connected by a control lead 25 to a timer 26, which is started by the output signal of the comparator 18 as soon as the frequency changes at a significant rate. Under the control of the timer 26, the signal which appears at the output of the sample and hold circuit 21 about 10 seconds after a disturbance has appeared, is sampled and stored by the sample and hold circuit 24 whereas the signal which appears at the output of the filter 3 about 1 second before the maximum frequency drop, is stored in a known manner in the sample and hold circuit 22. The output signals of the sample and hold circuits 22 and 24 are delivered to the comparator 8 and are processed as has been described hereinbefore. About 70 seconds after a disturbance has appeared, the sample and hold circuits 22 and 24 are reset by a signal delivered by the timer 26 via the resetting signal lead 27 so that the circuitry is then prepared for a new measurement. Resetting signals appearing at the output 16 of the comparator 13 can be used to reset the circuitry if properly gated with the resetting signals in lead 27 and serve also to reset the indicators of the arrangement, particularly if these indicators are digital ones.

A peak-holding circuit 28 which is responsive to the maximum frequency change rate is connected to the output of the measuring transducer 19 and is started as soon as the rate of frequency change exceeds the threshold value which has been set by the threshold value signal generator 17. For this purpose, a switch actuator 29 of the holding circuit 28 is connected to the output lead of the comparator 18, as is apparent from FIG. 2. The signal which represents the maximum rate of frequency change is held by a sample and hold circuit 30, which has a control input connected to a differential amplifier 31, which compares the signal values at the input and output of the sample and hold circuit 30. Details can readily be taken from FIG. 2 by a person skilled in the art. It is pointed out that the peak negative rate of frequency change is preferably held in the sample and hold circuit 30 because it is of primary interest to detect and compensate frequency decreases and frequency drops in the power supply system.

The output signals of the multiplication circuit 9 and of the peak-holding circuit are delivered to an arithmetic network 32, as is apparent from FIG. 1. At other suitable inputs, the arithmetic network 32 receives selectable signals, which represent constants. The arithmetic network 32 generates an output signal Z in accordance with the equation $$Z = Z_o\, e^{\alpha \frac{PA}{f_{max}}}$$

wherein $Z_o$ is a constant which can be applied as a selectable signal value, $\alpha$ is another constant, which can also be applied as a selectable signal, PA is the output signal of the multiplication circuit 9 and $f_{max}$ is the output of peak holding circuit 28. The output of the arithmetic network 32 is delivered to a second indicator 33 which, in dependence on its calibration, responds to the appearance of a disturbance by giving an indication of the distance between the location at which monitoring takes place and the origin of the disturbance or an indication of the equivalent impedance between the monitoring location and the origin of the disturbance. This is due to the recognition that said distance and/or impedance value is related by an exponential function to the ratio between the disturbing power and the maximum rate of frequency change.

Figure 2:
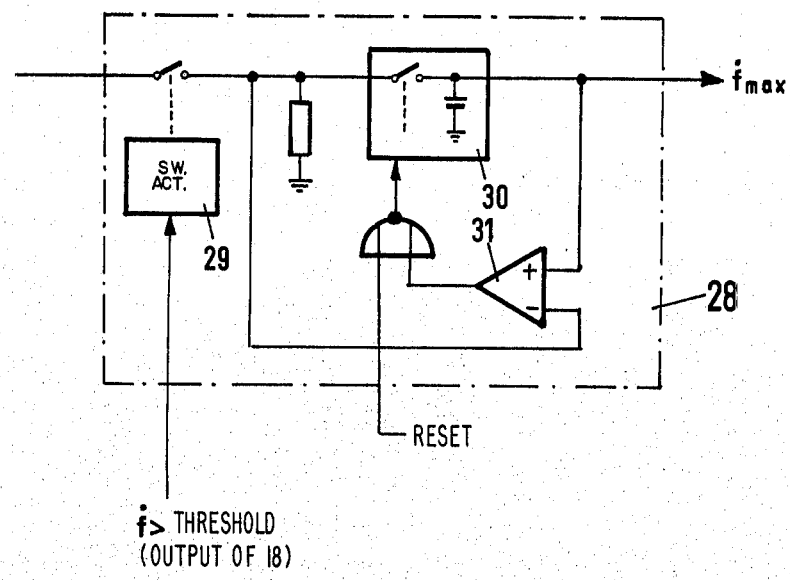
FIG. 2 is a simplified circuit diagram showing a peak-holding circuit, which is associated with the measuring circuitry for ascertaining the rate of frequency change.

The use of an arrangement as shown in FIGS. 1 to 3 in an adaptive automatic frequency control system will now be explained with reference to FIGS. 4 and 5.

The equipment to be controlled comprises the power supply system 1, to which the measuring transducer 2 is connected, the output signal of which represents the instantaneous frequency in the power supply system 1. The instantaneous frequency signal is compared in a differential amplifier 35 with a desired frequency signal, which is delivered by an adjustable desired value signal generator 36. The differential amplifier 35 is succeeded by a differential amplifier 37 and a differential amplifier 38. The output signal of the differential amplifier 35 is compared with a signal corresponding to the upper limit of positive frequency deviation in the differential amplifier 37, and is compared with a signal corresponding to the lower limit of negative frequency deviation in the differential amplifier 38. These limit signals are delivered by limit signal generators 39 and 40, respectively, and, for the instantaneous frequency in the power supply system 1, determine an upper frequency limit $f_o$ and a lower frequency limit $f_u$ above and below which a response of the automatic control system is to be initiated. This will be explained more fully hereinafter. It is to be noted, however, that the processing of the output signals of the limit signal generators 39 and 40 in the differential amplifiers 37 and 38, respectively, is not effected in order to initiate the response of the automatic control system but serves for determining a specific signal processing by which a control signal for the actuator 41 is derived in accordance with a specific function from the error signal which is produced by the differential amplifier 35 as a result of the comparison of the desired and instantaneous values. For this purpose, the differential amplifier 37 is succeeded by an arithmetic network 42, which performs the following arithmetic operation:

$$1 - e^{a(\Delta f - f_o)}$$

wherein a is a factor which can be applied as a selectable signal and $(\Delta f - f_o)$ is the output signal of the differential amplifier 37.

The differential amplifier 38 is succeeded by an arithmetic network 43, which performs the following arithmetic operation:

$$e^{a(f_u - \Delta f)} - 1$$

wherein a is again a factor which can be applied as a selectable signal and $(f_u - \Delta f)$ is the output signal of the differential amplifier 38. In response to the closing of a switch 44, the output signal which has been derived by the arithmetic network 42 from the error signal delivered by the differential amplifier 35, is applied to the actuator 41 when the instantaneous frequency in the power supply system 1 exceeds a higher upper limit $f_{oo}$, which is indicated by a limit signal generator 45 and is compared in the comparator 46 with the instantaneous frequency signal. In that case the output of the comparator 46 is applied to an actuator 47, which actuates the switch 44 and in addition causes one input of the comparator 46 to be switched from one input of the limit signal generator 45 to another. The signal appearing at said other input of the limit signal generator 45 represents an upper frequency limit which is nearer to the desired frequency. As a result that channel of the automatic control system which includes the arithmetic network 42 exhibits a hysteresis behaviour and starts when the instantaneous frequency rises above the frequency limit $f_{oo}$ and is not disabled until the instantaneous frequency has decreased below $f_o$. It will be understood that the limit signal which is applied to the comparator 46 to define the frequency $f_o$ may be taken from the limit signal generator 39. This is not shown in FIG. 4 for better clearness of the circuit diagram. It is also apparent from FIG. 4 that the limit signal generators 39, 40, 45, 49 and 58 are coupled to the desired value signal generator 36. That coupling is indicated by an arrow k and, when the desired frequency is arbitrarily adjusted, provides for a suitable correction or readjustment of the limit signals delivered by the limit signal generators.

In response to the closing of the switch 48, the output signal derived by the arithmetic network 43 from the error signal of differential amplifier 35, is applied to the actuator 41 when the instantaneous frequency should have dropped below a second lower frequency limit $f_{uu}$ which is indicated by a limit signal generator 49 and is compared with the output signal of the measuring transducer 2 in the comparator 50. The output signal of the comparator 50 is applied to a switch actuator 51, which actuates the switch 48 as well as a change-over switch, which is associated with the limit signal generator 49, so that the channel which includes the arithmetic network 43 exhibits a hysteresis behavior as a result of an operation which is similar to the one described with reference to the limit signal generator 45, the comparator 46 and the switch actuator 47.

It is apparent from FIG. 5 that load changes which may occur in the power supply system and result in frequency deviations above a second upper limit $f_{oo}$ or below a second lower limit $f_{uu}$, will initiate a progressive automatic control in accordance with the exponential functions for which the arithmetic networks 42 and 43 have been programmed, as long as the frequency change rate does not exceed a predetermined value. To effect a progressive automatic control, the actuator 41 will adjust a valve in the pressure fluid supply conduit leading to a prime mover which drives the generator. Such valve is diagrammatically indicated in FIG. 4 at 52.

If the load change in the power supply system exceeds a predetermined value with the frequency change rate being also critical, the automatic control is effected in accordance with a proportional characteristic in order to correct the frequency in the power supply system 1 as soon as possible. For this purpose the output signal of the differential amplifier 38 is processed in the arithmetic network 53 in accordance with the function $$b(f_u - \Delta f)$$

wherein b is a constant, which can be delivered to the network as a selectable signal, and $(f_u - \Delta f)$ is the output signal of the differential amplifier 38. In response to the closing of the switch 54, the output signal of the arithmetic network 53 is applied as a control signal to the actuator 41. The switch 54 is closed when the operation of the switch actuator 55 is initiated because all inputs to AND gate 56 are energized.

An automatic control according to a proportional characteristic will be initiated only in response to a negative frequency deviation, which is indicated to the AND gate 56 by the comparator 57, in which the instantaneous frequency is compared with the or a lower limit $f_u$. This lower limit is indicated by the output signal of the limit signal generator 58 or by the above-mentioned limit signal generator 40.

Figure 4:
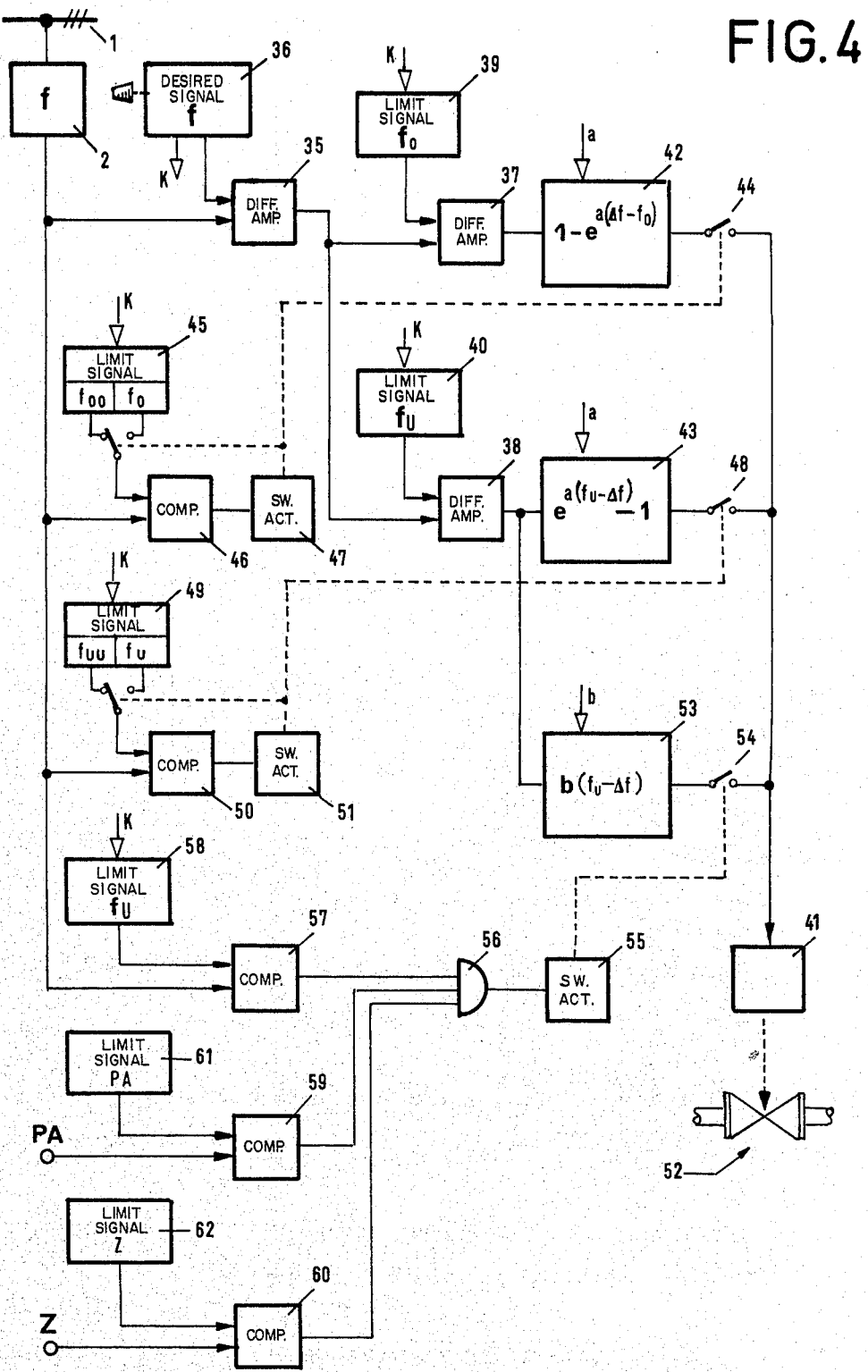
FIG. 4 is a block circuit diagram showing an automatic frequency control system for an adaptive automatic frequency control.
Figure 5:
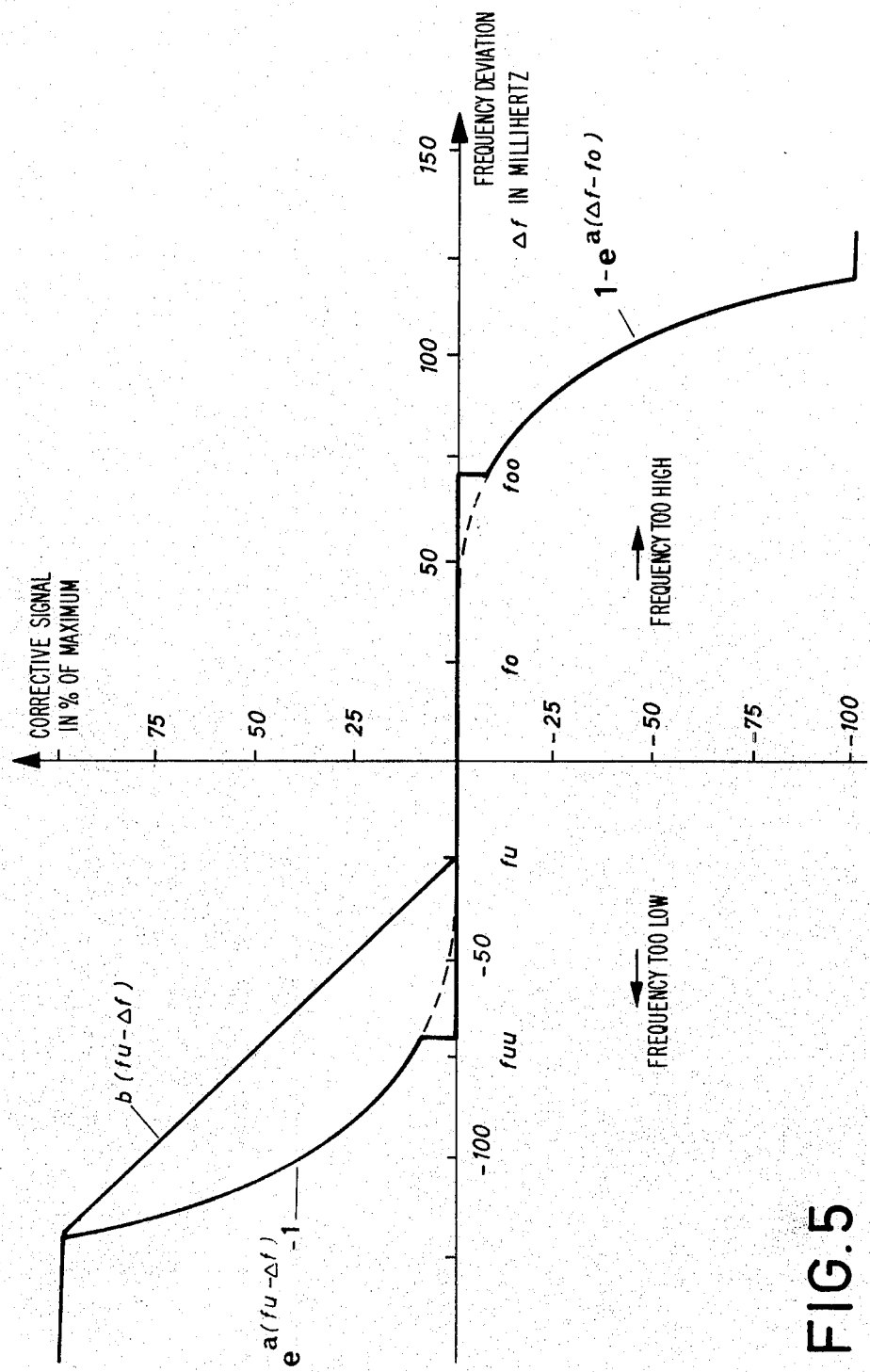
FIG. 5 is a diagram showing the automatic control characteristic of the automatic control system of FIG. 4.

It is also apparent from FIG. 4 that an additional input of the AND gate receives signals which have been delivered by the circuitry shown in FIG. 1. The terminals PA and Z shown in FIG. 4 constitute the output terminals of the multiplication circuit 9 and of the arithmetic network 32, respectively. The signals appearing at said terminals are compared in respective comparators 59 and 60 with respective limit signals delivered by limit signal generators 61 and 62, respectively. As a result, all input signals required by the AND gate 56 to produce an output are available when a disturbing power change exceeds a certain limit and when the effective equivalent impedance between the monitored location and the origin of the disturbance exhibits a change which exceeds a limit by a predetermined amount.

It is apparent that the automatic control system which has been proposed herein provides suitable automatic control characteristics for all modes of operation of the power supply system and all kinds of disturbances of the power supply system and can also furnish complete information on the nature and origin of the disturbance. The information which is furnished by the indicators 12 and 33 usually permits an exact determination of the origin of the disturbance, e.g., in case of a failure of a power plant, even over a distance of several hundreds of kilometers. This can be accomplished within very short time and without need for a separate telecommunication link.

What I claim is:

1. An arrangement for detecting network frequency influencing disturbances in electric power supply systems, said arrangement comprising:
   first measuring circuit means coupled to said power supply system for ascertaining the deviation of the frequency of said system from a desired frequency, said first measuring circuit comprising:
      a delay and sample circuit having a plurality of outputs, a first of said outputs delivering a signal representing the system frequency immediately prior the appearance of the disturbance, a second of said outputs delivering a signal representing the system frequency shortly after the appearance of the disturbance;
   a comparator adapted to receive said first and second output signals from said delay and sample circuit and to provide an output signal;
   means for multiplying the output of said comparator by a network power factor proportional to the magnitude of the disturbing power per unit of frequency deviation, said network power factor being selected for the specific power supply system being monitored; and
   a first indicator coupled to the output of said multiplying means to provide an indication of the value of the disturbing power which causes the frequency disturbance.

2. The arrangement recited in claim 1 and further comprising:
   second measuring circuit means coupled to said power supply system for ascertaining the rate of frequency change and producing a signal representative of the frequency change rate;
   means for providing a signal representing a threshhold value of frequency change rate;
   a second comparator adapted to receive said threshhold value signal and said frequency change rate signal from said second measuring circuit means and to provide an output signal when said frequency change rate exceeds said threshhold value;
   a timer connected to said first measuring circuitry and said frequency rate comparator, said timer providing a plurality of clock signals for controlling said delay and sample circuit in response to a signal from said frequency rate comparator.

3. An arrangement for detecting network frequency influencing disturbances in electric power supply systems, said arrangement comprising:
   first measuring circuit means coupled to said power supply system for ascertaining the deviation of the frequency of said system from a desired frequency, said first measuring circuit comprising:
      a delay and sample circuit having a plurality of outputs, a first of said outputs delivering a signal representing the system frequency immediately prior the appearance of the disturbance, a second of said outputs delivering a signal representing the system frequency shortly after the appearance of the disturbance;
   second measuring circuit means coupled to said power supply system for ascertaining the rate of frequency change;
   a timer connected to said first and second measuring circuitry, said timer providing a plurality of clock signals for controlling said delay and sample circuit;
   a comparator adapted to receive said first and second output signals from said delay and sample circuit and to provide an output signal;
   means for multiplying the output of said comparator by a network power factor proportional to the magnitude of the disturbing power per unit of frequency deviation, said network power factor being selected for the specific power supply system being monitored; and
   a first indicator couple to the output of said multiplying means to provide an indication of the value of the disturbing power which causes the frequency disturbance.

4. The arrangement recited in claim 3 and further comprising:
   a peak holding circuit coupled to said second measuring circuit means and adapted to deliver an output signal representing an ascertained maximum frequency change rate;
   an arithmetic network, the inputs thereto being the output of said multiplication circuit and the output of said peak holding circuit, said arithmetic network producing an output signal Z in accordance with the following arithmetic operation:

$$Z = Z_0 \, e^{a \frac{PA}{f_{max}}}$$

where $Z_o$ and $\alpha$ are selectable constants applied to said arithmetic network, PA is the output signal from said multiplication circuit and $\dot{f}_{max}$ is the output signal from said peak holding circuit; and a second indicator coupled to the output of said arithmetic network to provide an indication corresponding to the distance between the location at which monitoring takes place by means of said arrangement and the origin of the disturbance, the indication of said second indicator further corresponding to the equivalent impedance of said power supply system between the monitoring location and the origin of the disturbance.

5. The arrangement recited in any of claims 3 wherein:

said delay and sample circuit comprises:

a pair of series-connected sample and hold circuits operated in alternation in response to an input signal corresponding to an instantaneous frequency; and first and second additional sample and hold circuits coupled to the output of said pair of sample and hold circuits, said additional sample and hold circuits functioning as storage devices;

said first additional sample and hold circuit is controlled by said timer to have an output signal representative of the frequency of said system prior to the appearance of the disturbance; and said second additional sample and hold circuit having an output signal representing the frequency of said system ascertained a predetermined time after the disturbance has appeared.

6. A method for automatically controlling frequency in an electrical power supply system by means of an adaptive automatic frequency control system having a plurality of predetermined automatic control modes and being at least partially controlled by a network for detecting frequency influencing disturbances in said power supply system, said method comprising the steps of:

measuring the instantaneous system frequency;

providing a first signal representing the system frequency immediately prior to the appearance of the disturbance;

providing a second signal representing the system frequency shortly after the appearance of the disturbance;

comparing said first and second signals and providing a first output signal resulting from said comparison;

ascertaining the rate of change of the frequency of said system;

selecting a network power factor proportional to the magnitude of the disturbing power per unit of frequency deviation for the specific power supply system being monitored;

multiplying said first output signal by said network power factor;

applying the thus multiplied output signal to indicating means to indicate the value of the disturbing power which caused the frequency disturbance;

setting a predetermined limit upon said multiplied output signal;

changing said adaptive automatic frequency control system from one control mode to another depending upon the rate of change of the frequency of said system, said change of control mode being effected when said multiplied output signal exceeds said predetermined limit.

7. The method recited in claim 6 and comprising the further steps of:

ascertaining the maximum rate of change of the system frequency;

providing a second output signal representing said maximum rate of change;

combining said second output signal and said multiplied output signal in an arithmetic network and producing an output signal Z in accordance with the following arithmetic operation:

$$Z = Z_o\, e^{\alpha \frac{PA}{\dot{f}_{max}}}$$

where $Z_o$ and $\alpha$ are selectable constants, PA is said multiplied output signal, $\dot{f}_{max}$ is the maximum rate change output signal and Z represents the impedance between the monitoring location and the origin of the disturbance, said impedance being proportional to the distance between the monitoring location and the location of the origin of the disturbance;

setting a predetermined limit upon the value of Z; and changing said adaptive automatic frequency control system from one control mode to another when said multiplied output signal representing disturbing power exceeds the predetermined limit thereon and said output signal Z exceeds the predetermined limit thereon.

8. The method recited in either of claims 6 or 7 wherein the change in mode is effected from a progressive automatic control mode to a proportional automatic control mode.

* * * * *

UNITED STATES PATENT AND TRADEMARK OFFICE
CERTIFICATE OF CORRECTION

PATENT NO. : 4,349,878
DATED : September 14, 1982
INVENTOR(S) : GERMAN GRIMM

It is certified that error appears in the above-identified patent and that said Letters Patent are hereby corrected as shown below:

Column 8, Claim 4, line 53, after the word "claim", insert -- 3 or 2--.

Signed and Sealed this

Eleventh Day of January 1983

[SEAL]

Attest:

GERALD J MOSSINGHOFF

Attesting Officer

Commissioner of Patents and Trademarks